United States Patent
Kao et al.

(10) Patent No.: US 8,924,800 B2
(45) Date of Patent: Dec. 30, 2014

(54) REMOTE MONITORING SYSTEMS AND RELATED METHODS AND RECORDING MEDIUMS USING THE SAME

(71) Applicant: Institute for Information Industry, Taipei (TW)

(72) Inventors: Chih-Chiang Kao, Guishan Township (TW); Chun-Tai Yen, Taipei (TW); I-Lin Liu, New Taipei (TW); Chih-Chieh Lin, Taipei (TW); Ren-Dar Yang, Hsinchu (TW); Hung-Sheng Chiu, Taipei (TW); Yu-Shiang Hung, Taipei (TW)

(73) Assignee: Institute for Information Industry, Taipei (TW)

( * ) Notice: Subject to any disclaimer, the term of this patent is extended or adjusted under 35 U.S.C. 154(b) by 155 days.

(21) Appl. No.: 13/713,114

(22) Filed: Dec. 13, 2012

(65) Prior Publication Data

US 2014/0136911 A1 May 15, 2014

(30) Foreign Application Priority Data

Nov. 14, 2012 (TW) .............................. 101142336 A

(51) Int. Cl.
| | |
|---|---|
| *G01R 31/28* | (2006.01) |
| *G01R 31/317* | (2006.01) |
| *G06F 11/36* | (2006.01) |
| *G05B 19/00* | (2006.01) |
| *G05B 19/05* | (2006.01) |

(52) U.S. Cl.
CPC .......... *G01R 31/31705* (2013.01); *G06F 11/36* (2013.01); *G05B 19/00* (2013.01); *G05B 19/058* (2013.01)
USPC ....................................................... 714/724

(58) Field of Classification Search
CPC ................ G06F 19/3468; G06F 11/36; G01R 31/31705; G05B 19/00
USPC ................................ 714/724; 604/67; 700/17
See application file for complete search history.

(56) References Cited

U.S. PATENT DOCUMENTS

| | | | | |
|---|---|---|---|---|
| 7,193,501 | B1 * | 3/2007 | Albarado et al. .............. | 340/3.1 |
| 2006/0212161 | A1 * | 9/2006 | Bhat et al. ..................... | 700/197 |
| 2008/0306436 | A1 * | 12/2008 | Edwards et al. ................ | 604/67 |

FOREIGN PATENT DOCUMENTS

| | | |
|---|---|---|
| CN | 1648807 A | 8/2005 |
| EP | 1 200 884 B1 | 8/2005 |
| TW | 200615721 A | 5/2006 |
| TW | M382509 U1 | 6/2010 |

* cited by examiner

*Primary Examiner* — Guy Lamarre
(74) *Attorney, Agent, or Firm* — Birch, Stewart, Kolasch & Birch, LLP

(57) ABSTRACT

Remote monitoring systems for remotely monitoring execution status of a PLC (Programmable Logic controller) program of a machine include a storage module, a parameter retrieval module and a monitoring module. The storage module stores ladder diagram information corresponding to a PLC source program, wherein the ladder diagram information includes PLC signal address relation information, a plurality of logic switches and a responsive collect command of each logic switch of a ladder diagram. The PLC signal address relation information indicates the relations of the logic switches on the ladder diagram. The parameter retrieval module respectively retrieves parameter data corresponding to the logic switches using the responsive collect commands. The monitoring module generates a status of ladder diagram according to the logic switches, the parameter data and the PLC signal address relation information to display the parameter data corresponding to each logic switch when the machine is executing the PLC source program.

15 Claims, 5 Drawing Sheets

REMOTE MONITORING SYSTEMS AND RELATED METHODS AND RECORDING MEDIUMS USING THE SAME

CROSS REFERENCE TO RELATED APPLICATIONS

This Application claims priority of Taiwan Application No. 101142336, filed on Nov. 14, 2012, and the entirety of which is incorporated by reference herein.

BACKGROUND OF THE INVENTION

1. Field of the Invention

The disclosure relates generally to remote monitoring systems and remote monitoring methods thereof, and, more particularly to remote monitoring systems and remote monitoring methods thereof capable of generating a status of ladder diagram for remotely monitoring execution status of a Programmable Logic controller (PLC) program of a machine according to logic switches and a PLC signal address relation information of the PLC program and parameter data for the machine when the machine is executing the PLC source program.

2. Description of the Related Art

Programmable logic controllers (PLC), as the core of machine operation, are widely used on machines such as machine tools for processing or testing. The PLC often set on the machine body or near the machine. The PLC programs can often be developed and designed by a ladder diagram, wherein the ladder diagram was a automatic control graphic language applied to a variety of the machines. There are multiple logic switches on the ladder and a PLC signal address relation information among the logic switches. The commercially available tools include, for example, FXGP-WIN, CX-Programmer, GX Developer (Mitsubishi program ladder) and so on. When the machine is executing the PLC programs, staff of the factory may understand operation status of the execution of the PLC programs of the machine through the status of ladder diagram provided by the PLC itself, in which the status of ladder diagram is primarily combining the PLC program of the ladder diagram with parameter data on the machine to show the status of each logic switch on the ladder diagram when the PLC program is being executed. When the machine has a breakdown, staff usually check the PLC first and look at the PLC status of ladder diagram to judge the possible reason of that breakdown. In the art, current PLC status of ladder diagram only can be displayed on the machine or PLC in the factory locally. It cannot directly be provided to remote side (such as for developer of manufacturers, maintenance people to look at) so that the people on remote end cannot judge the reason for the breakdown. The status of the ladder or the machine signals usually is informed to the remote staff through the person in the factory by telephone. Otherwise the remote staff may go to the factory and look at the PLC status of the ladder and judge the reason. It is very inconvenient for debugging and more time consuming.

To solve the above problem, additional cameras or image capture device are set up on some machines to directly shoot or capture the PLC status of ladder diagram and then transmit the shot screen image to the remote side for debugging. In this kind of implementation, however, installation of exclusive software and hardware are required on the machines by the OEM controller, so that the screen image of the PLC status of ladder diagram can be transmitted to the remote side for debugging in real time. It will resulting in a high replacement cost. Meanwhile, the screen image of the PLC status of ladder diagram which is transmitted to the remote side may easily be distorted. The remote staff may only look the transmitted image and cannot select the wanted image of ladder diagram for debugging. Therefore the remote staff can not efficiently determine possible fault causes for the machine based on only the transmitted PLC status of ladder diagram.

BRIEF SUMMARY OF THE INVENTION

Remote monitoring systems and remote monitoring methods using the same are provided.

An embodiment of a remote monitoring system for remotely monitoring execution status of a Programmable Logic controller (PLC) program of a machine comprises a storage module, a parameter retrieval module and a monitoring module. The storage module stores ladder diagram information corresponding to a PLC source program of the machine, wherein the ladder diagram information includes a PLC signal address relation information, a plurality of logic switches and a responsive collect command of each logic switch of a ladder diagram, and the PLC signal address relation information indicates the relations of the logic switches on the ladder diagram. The parameter retrieval module respectively retrieves parameter data corresponding to the logic switches using the responsive collect commands of the logic switches. The monitoring module generates a status of ladder diagram according to the logic switches, the parameter data and the PLC signal address relation information, wherein the status of ladder diagram displays the parameter data corresponding to each logic switch of the ladder diagram when the machine is executing the PLC source program.

In another embodiment, a remote monitoring method for remotely monitoring execution status of a Programmable Logic controller (PLC) program of a machine is provided. The method comprising the steps of utilizing a storage module for storing ladder diagram information corresponding to a PLC source program of the machine, wherein the ladder diagram information includes a PLC signal address relation information, a plurality of logic switches and a responsive collect command of each logic switch of a ladder diagram, and the PLC signal address relation information indicates the relations of the logic switches on the ladder; utilizing a parameter retrieval module for respectively retrieving parameter data corresponding to the logic switches using the responsive collect commands of the logic switches; and utilizing a monitoring module for generating a status of ladder diagram according to the logic switches, the parameter data and the PLC signal address relation information, wherein the status of ladder diagram displays the parameter data corresponding to each logic switch of the ladder diagram when the machine is executing the PLC source program.

Remote monitoring methods and systems may take the form of a program code embodied in a tangible media. When the program code is loaded into and executed by a machine, the machine becomes an apparatus for practicing the disclosed method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of the invention provide remote monitoring systems and methods for monitoring PLC statuses of a machine which can obtain a status of ladder diagram when the machine is executing the PLC source program. In the systems and methods, the execution status of the PLC program of the machine can be monitored remotely in real time without the use of image processing technology. The systems and methods of the invention can acquire parameter data for each of PLC logic switches of a PLC program executed on a machine (e.g. a machine tool) when the PLC program is executed by the machine, transmit the acquired parameter data to the remote side and then generate a responsive PLC status of ladder diagram in real time. The PLC status of ladder diagram is based on the logic switches, the parameter data and a PLC signal address relation information of the logic switches for displaying the parameter data corresponding to each logic switch of the ladder diagram when the machine is executing the PLC source program. It can be provided to observe and browse by the people at the remote side when real-time monitoring remotely.

Figure 1A:
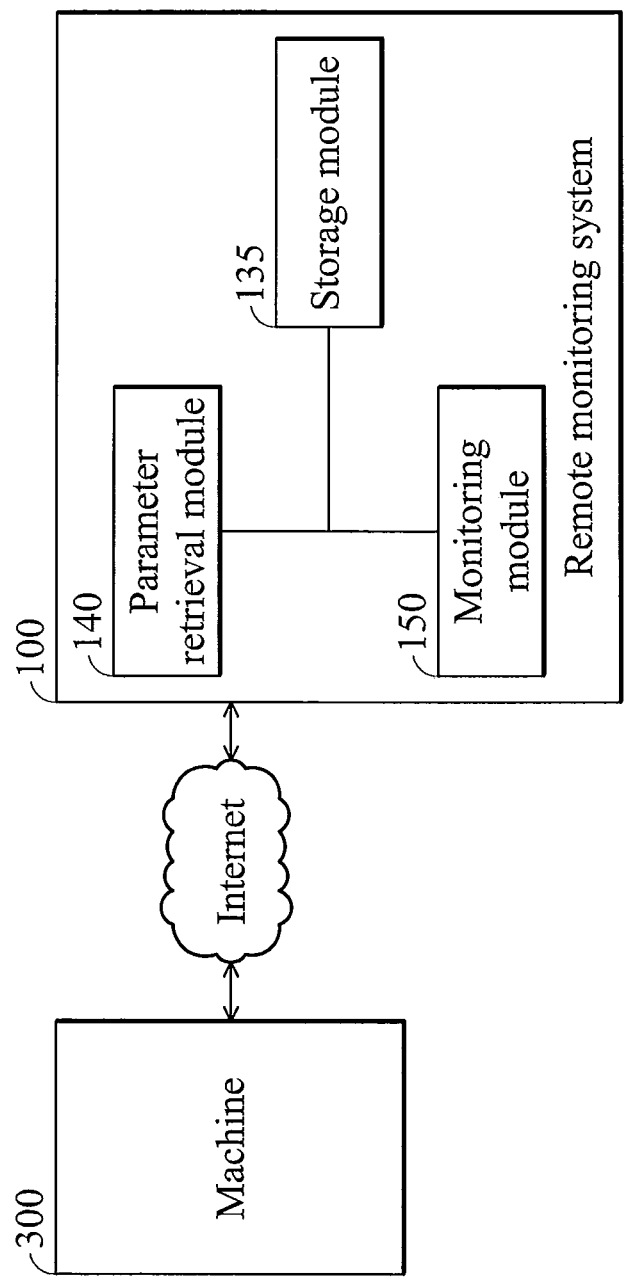
FIG. 1A is a schematic diagram illustrating an embodiment of a remote monitoring system of the invention.

FIG. 1A is a schematic diagram illustrating an embodiment of a remote monitoring system of the invention. The remote monitoring system 100 mainly comprises a storage module 135, a parameter retrieval module 140 and a monitoring module 150. The remote monitoring system 100 can establish a communication link with a remote machine 300 to communicate with the machine 300 remotely via a communication network. The storage module 135 is a device for storing data, which typically stores digital data using electrical, magnetic or optical storage media. The storage module 135 may be, for example, commercially available devices or equipments, such as various types of memories, hard disks, floppy disks, magnetic tapes, CD/DVD, MO (magneto-optical), or any kind of computers, servers, and so on. The parameter retrieval module 140 and the monitoring module 150 can be software, which may then be read and implemented by a processor or electronic devices. They can also be a firmware, which burns the software in an application specific integrated circuit (ASIC), a Flash memory, a EEPROM or a PROM. The functionalities of each module will be detailed in below.

The storage module 135 is used for storing ladder diagram information corresponding to a PLC source program of the machine 300, wherein the ladder diagram information includes a PLC signal address relation information, a plurality of logic switches and a responsive collect command for each logic switch of the machine 300. The PLC source program corresponds to a ladder diagram, that is, corresponds to the plurality of logic switches of the ladder diagram and PLC signal address relation information of the logic switches and so on. The PLC signal address relation information is used for indicating the relations of these logic switches on the ladder diagram. In this embodiment, the PLC source program may be designated and developed by a ladder diagram development software, wherein the PLC source program contains multiple logic switches and the logic switches has an PLC signal address relation information thereamong. Each logic switch on the ladder diagram corresponds to an operation on the machine 300, such as a switch X0.3 is in off status indicating that a sprinkler system for the machine 300 is normally connected while the switch X0.3 is in on status indicating that the sprinkler system is disconnected. Thus, it can be determined whether a logic switch is operated normally during the time of execution of the PLC program by retrieving the parameter data (such as on/off or 0/1) corresponding to that logic switch from the machine 300.

The parameter retrieval module 140 is mainly used for respectively retrieving parameter data corresponding to the logic switches from the machine 300 using the responsive collect commands of the logic switches. The monitoring module 150 is mainly used for generating a status of ladder diagram according to the logic switches and the PLC signal address relation information thereamong stored in the storage module 135 and the parameter data retrieved by the parameter retrieval module 140. The status of ladder diagram can be used to display each logic switch of the ladder diagram and the parameter data corresponding to each logic switch of the ladder diagram when the machine 300 is executing the PLC source program. As it can be determined whether a logic switch is operated normally during the time of execution of the PLC program by its responsive parameter data, the status of ladder diagram can be provided to the people at the remote side for status determination.

Furthermore, the remote monitoring system 100 may further comprise a program retrieval module and an interpreter module (not shown in FIG. 1A). The program retrieval module is used for retrieving the PLC source program of the machine 300. The PLC source program codes can be binary codes which are generated by compiling a ladder diagram that is designated by designers. The PLC source program codes correspond to the PLC signal address relation information, the logic switches and the responsive collect command of each logic switch of the ladder diagram. The interpreter module is used for interpreting the PLC source program retrieved by the program retrieval module to obtain information corresponding to the PLC source program, such as the PLC signal address relation information, the logic switches and the responsive collect commands corresponding to the PLC source program. Then, the interpreted information, such as the PLC signal address relation information, the logic switches and the responsive collect commands, is stored to the storage module 135.

Figure 1B:
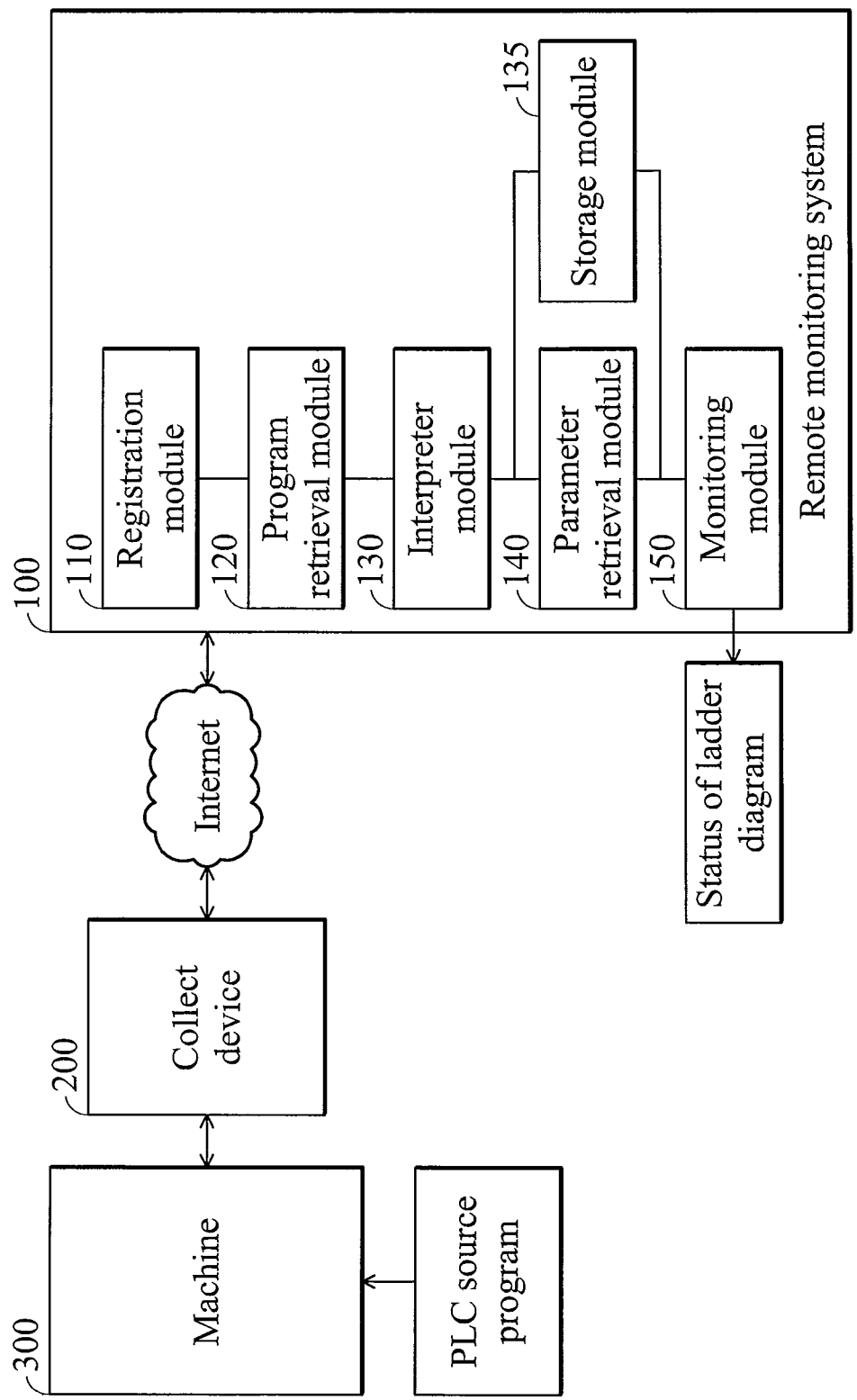
FIG. 1B is a schematic diagram illustrating an embodiment of a remote monitoring system of the invention.

FIG. 1B is a schematic diagram illustrating another embodiment of system architecture of the invention. It is noted that, elements illustrated in FIG. 1B with numbers as same as those illustrated in FIG. 1A are the same elements, thus their functionalities are omitted here for brevity. As shown in FIG. 1B, a remote monitoring system 100, a collect device 200 and a machine 300 are illustrated in this embodiment. The collect device 200 (e.g. a set-top box of a machine tool) may be configured on the machine 300 (e.g. a machine tool) while the remote monitoring system 100 may couple to the collect device 200 via a network (e.g. the INTERNET) to retrieve data from the machine 300 via the collect device 200. To be more specific, the parameter retrieval module 140 of the remote monitoring system 100 may execute the collect commands to respectively retrieve the required parameter data from the machine 300 via the collect device 200. The program retrieval module 120 may also retrieve the PLC source program via the collect device 200. For example, the program retrieval module 120 may link to the collect device 200 such that the collect device 200 links to a controller of machine tool 300 (not shown in FIG. 1B) to obtain the PLC source program stored in the controller of machine tool and transmits the obtained PLC source program to the program retrieval module 120. The program retrieval module 120 may also link to the controller of machine tool 300 directly to obtain the PLC source program stored in the controller of machine tool without further linking to the collect device 200. In this embodiment, the remote monitoring system 100 may be, for example, computer systems such as personal computers, portable devices (e.g. notebooks), servers, and so on, however, it is to be understood that the invention is not limited thereto. In some embodiments, the PLC source program may be provided to the program retrieval module 120 via other equipments (such as a manufacturer-side computer equipment or an agent-side computer equipment) provided by the manufacturer or the agent of the machine 300. In other words, the program retrieval module 120 may link to a manufacturer-side equipment to obtain the PLC source program stored in the manufacturer-side equipment or link to an agent-side equipment to obtain the PLC source program stored in the agent-side equipment.

The remote monitoring system 100 of FIG. 1B comprises at least a registration module 110, a program retrieval module 120, an interpreter module 130, a storage module 135, a parameter retrieval module 140 and a monitoring module 150. The registration module 110 is used for receiving/acquiring a registration data corresponding to the machine 300. It is noted that functionalities of the program retrieval module 120, the interpreter module 130, the storage module 135, the parameter retrieval module 140 and the monitoring module 150 in FIG. 1B are the same as those in FIG. 1A and thus detailed are omitted here. The registration data includes an identification data corresponding to the machine 300 (e.g. a serial number of the machine 300) and a version of PLC program corresponding to the PLC source program (e.g. the version V2.1) for indicating the version of the PLC source program that is stored in the storage module 135.

In this embodiment, the PLC source program may be updated or replaced with a new version of the PLC source program and thus the ladder diagram information stored in the storage module 135 should be updated accordingly. Therefore, the program retrieval module 120 may further retrieve a current version of PLC program corresponding to a currently executed PLC source program of the machine 300, retrieve the version of PLC program from the registration module 110 and then compare and determine whether the version of PLC program matches the current version of PLC program. If matched, which indicates that the PLC source program is consistent with the currently executed PLC source program of the machine 300, the PLC source program is not updated and thus the ladder diagram information stored in the storage module 135 need not be updated. If not matched, which indicates that the PLC source program is not consistent with the currently executed PLC source program of the machine 300, the program retrieval module 120 is required to retrieve the currently executed PLC source program corresponding to the current version of PLC program and then the retrieved currently executed PLC source program is re-interpreted by the interpreter module 130. After the currently executed PLC source program has been retrieved, the interpreter module 130 may further interpret the retrieved currently executed PLC source program to obtain updated ladder diagram information, i.e. the PLC signal address relation information, the logic switches and the responsive collect commands corresponding to the currently executed PLC source program. Then, the PLC signal address relation information, the logic switches and the responsive collect commands are stored to the storage module 135 to update the stored PLC signal address relation information, the logic switches and the responsive collect commands respectively. After the ladder diagram information has been updated, the parameter retrieval module 140 may further retrieve updated parameter data using the updated collect commands. The monitoring module 150 may further generate the updated status of ladder diagram according to the updated parameter data and the updated PLC signal address relation information. The responsive remote monitoring method will be discussed further in the following paragraphs.

Figure 2A:
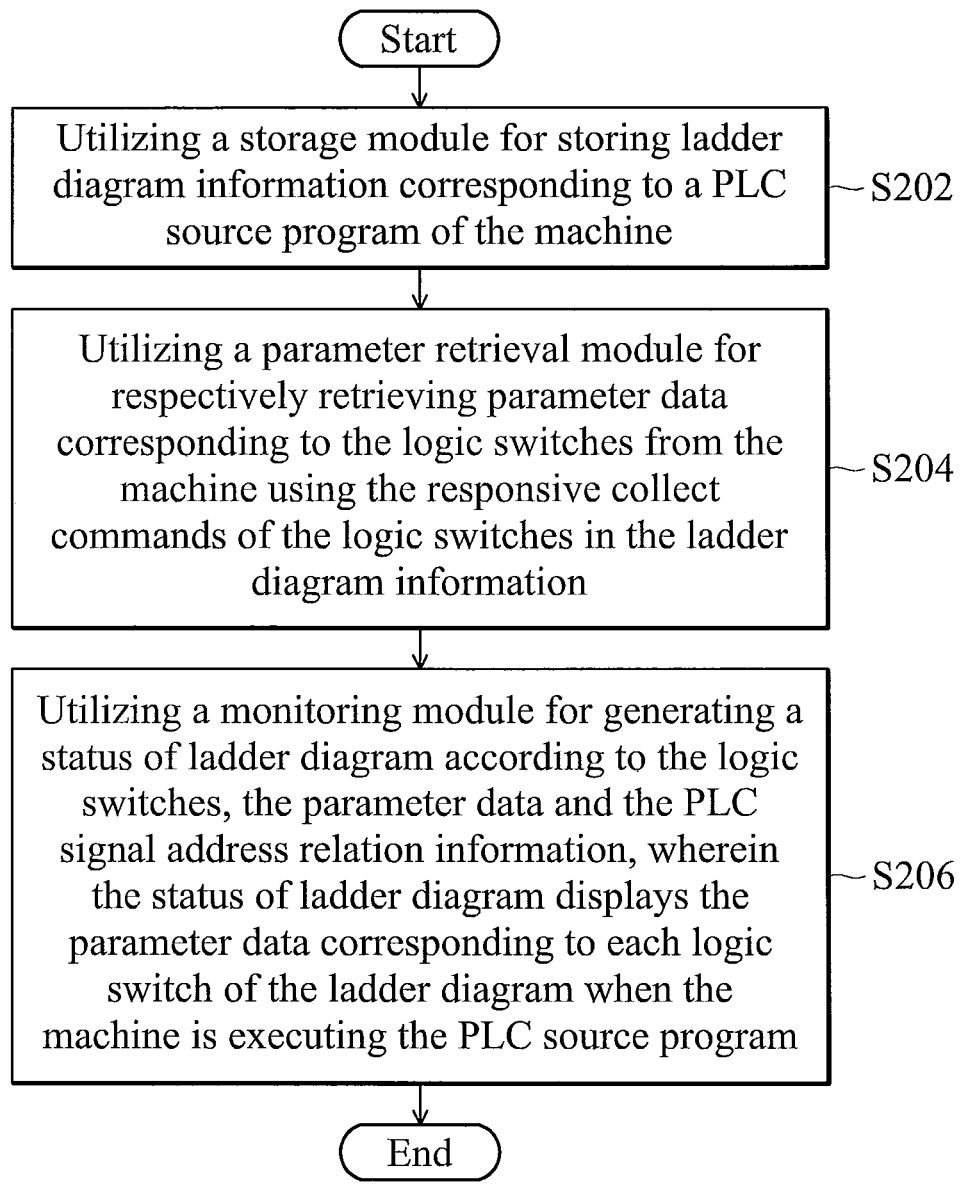
FIG. 2A is a flowchart of an embodiment of a remote monitoring method for remotely monitoring execution status of PLC program of a machine.

FIG. 2A is a flowchart of an embodiment of a remote monitoring method for remotely monitoring execution status of a PLC program of a machine. The method comprises the following steps.

In step S202, a storage module is utilized for storing ladder diagram information corresponding to a PLC source program of the machine, wherein the ladder diagram information includes a PLC signal address relation information, a plurality of logic switches and a responsive collect command of each logic switch of a ladder diagram, and the PLC signal address relation information indicates the relations of the logic switches on the ladder diagram.

In step S204, a parameter retrieval module is utilized for respectively retrieving parameter data corresponding to the logic switches from the machine using the responsive collect commands of the logic switches.

In step S206, a monitoring module is utilized for generating a status of ladder diagram according to the logic switches, the parameter data and the PLC signal address relation information, wherein the status of ladder diagram displays the parameter data corresponding to each logic switch of the ladder diagram when the machine is executing the PLC source program.

In the above-mentioned methods, the storage module, the parameter retrieval module and the monitoring module can be combined together by a same general purpose computer (e.g. a personal computer, a server or the like) to perform relevant steps of the methods by the same general purpose computer, or they can be separated by different processors or general purpose computers to perform relevant steps of the methods separately by different processors or general purpose computers and then be linked together via a computer serial port (e.g. RS232 port), a bus, a wired or wireless communication network and so on.

Figure 2B:
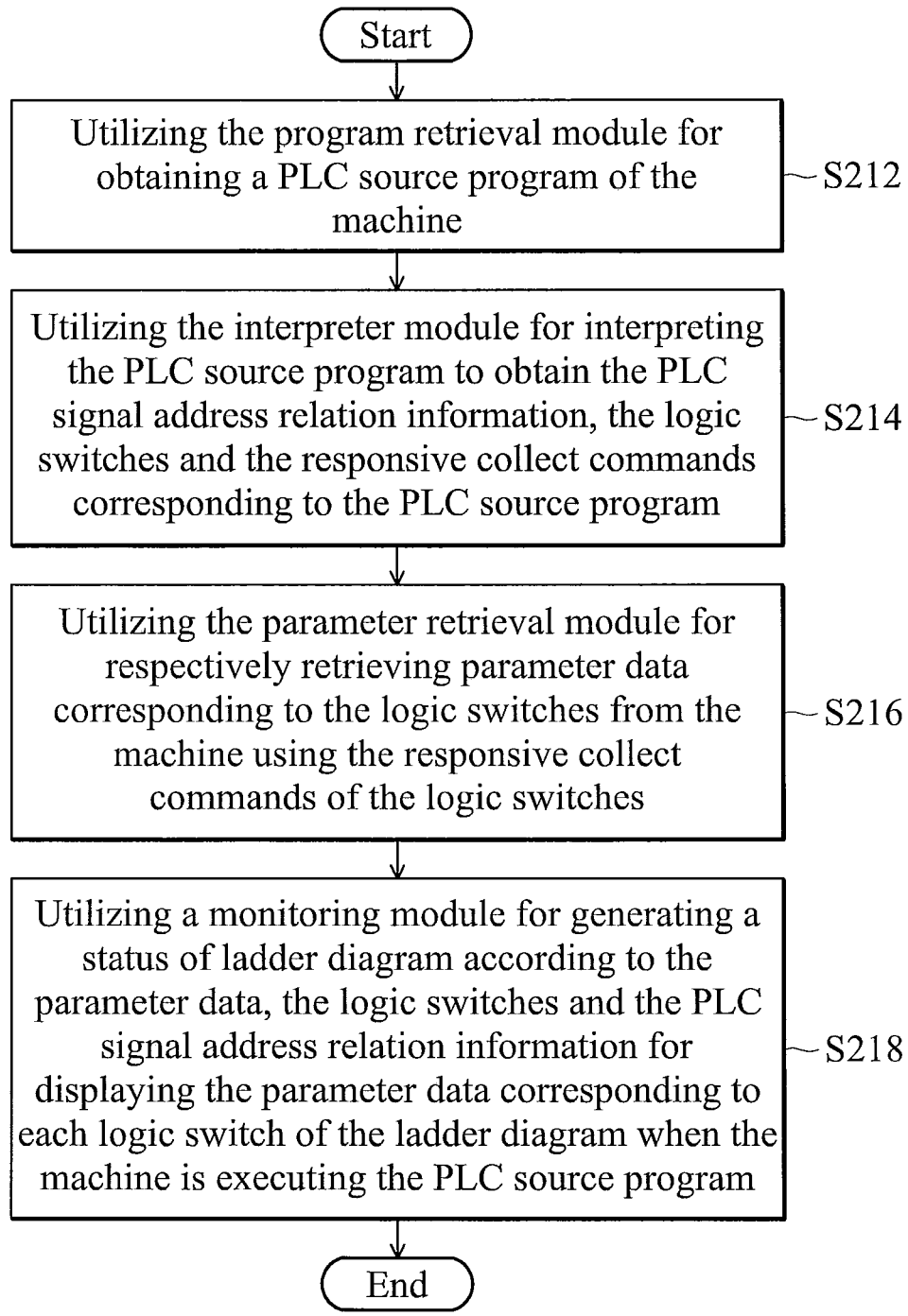
FIG. 2B is a flowchart of another embodiment of a remote monitoring method for remotely monitoring execution status of PLC program of a machine.

FIG. 2B is a flowchart of another embodiment of a remote monitoring method for remotely monitoring execution status of a PLC program of a machine. The remote monitoring method of the invention can be applied to a remote monitoring system (such as: the remote monitoring system 100) or can be performed by one or more processors or general purpose computers for remotely monitoring parameter data corresponding to each logic switch of the ladder diagram for a PLC source program when a machine (e.g. the machine 300) is executing the PLC source program.

First, in step S212, a PLC source program of the machine is obtained by utilizing the program retrieval module 120. In some embodiments, the manufacturer of the machine may provide a registration data of the machine in advance. In other embodiments, the program retrieval module 120 may retrieve/obtain the PLC source program of the machine from the manufacturer or the agent of the machine 300. Note that the PLC source program corresponds to a PLC signal address relation information, a plurality of logic switches and a responsive collect command of each logic switch of a ladder diagram, and the PLC signal address relation information indicates the relations of the logic switches on the ladder diagram.

After the PLC source program of the machine is obtained by the program retrieval module 120, in step S214, the interpreter module 130 is utilized for interpreting the PLC source program to obtain the PLC signal address relation information, the logic switches and the responsive collect commands corresponding to the PLC source program. In one embodiment, the PLC source program can be a file with a binary format which is formed by one or more subroutines and the step of utilizing the interpreter module 130 for interpreting the PLC source program of the machine may comprise, but not limited to, the following steps: first, expanding the source program file of the PLC source program to obtain the structure information for each subroutine; next, reading all PLC addresses in all of the subroutines, such as: X0.1; thereafter, recording operations of each address, such as: READ X0.1; and, forming the graphical structures of all addresses and their operations and generating responsive collect commands of all of the PLC addresses. Through the foregoing interpretation procedure to interpret the PLC source program, the PLC signal address relation information and the responsive collect commands of the logic switches corresponding to the PLC source program of the machine can be obtained.

After the PLC signal address relation information, the logic switches and the responsive collect commands corresponding to the PLC source program of the machine have been obtained, in step S216, the parameter retrieval module 140 is utilized for respectively retrieving parameter data corresponding to the logic switches from the machine using the responsive collect commands of the logic switches. In this step, the parameter retrieval module 140 may respectively retrieving parameter data corresponding to each of the logic switches (e.g. a status value of each logic switch) from the machine using the responsive collect command of the logic switch.

Figure 3:
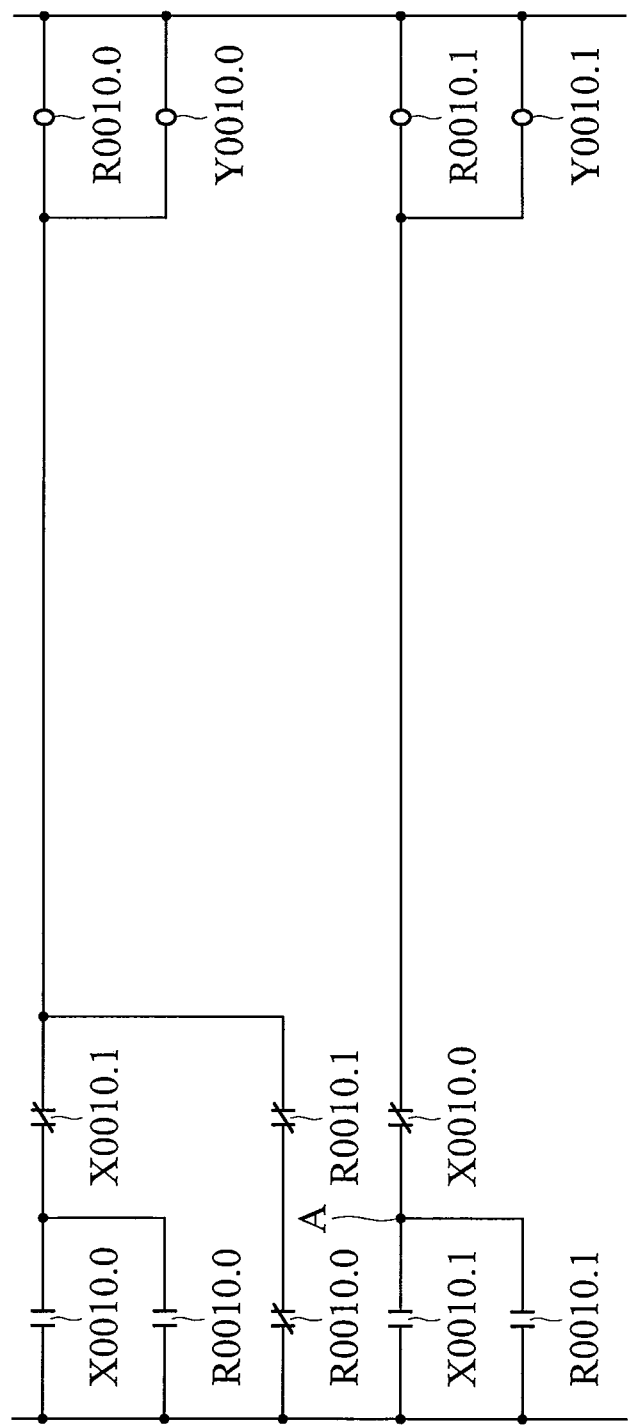
FIG. 3 is a schematic diagram illustrating an embodiment of a PLC status of ladder diagram of the invention.

After the parameter retrieval module 140 retrieves all of the parameter data corresponding to the logic switches, in step S218, a monitoring module is utilized for generating a status of ladder diagram according to the parameter data retrieved by the parameter retrieval module 140 and the logic switches and the PLC signal address relation information interpreted by the interpreter module for displaying the parameter data corresponding to each logic switch of the ladder diagram when the machine is executing the PLC source program, as shown in FIG. 3. FIG. 3 is a schematic diagram illustrating an embodiment of a PLC status of ladder diagram of the invention. For example, referring to FIG. 3, the logic switches "X0010.1", "X0010.0" and "R0010.1" are coupled together at point A and its structure is that the logic switches "X0010.1" and "X0010.0" are first coupled in a parallel connection and then coupled to the logic switch "R0010.1" in a series connection. Therefore, manufacturer's engineers may later perform a remote real-time monitoring and debugging operation based on the PLC status of ladder diagram generated by the monitoring module 150 and observe from the on or off status for each logic switch to find the error cause and fix it quickly.

In some embodiments, when the manufacturer of the machine 300 does not provide the registration data of the machine 300 or the machine 300 is a newly installed machine for new set of machine, the method of the present invention can first utilizes the registration module 110 to determine whether the machine 300 has been successfully registered, wherein when the machine 300 is not registered yet, a registration procedure will be performed to obtain a registration data corresponding to the machine 300, such as an identification data corresponding to the machine 300 and a version of PLC program corresponding to its PLC source program and then the preceding steps S212-214 are further performed to obtain the PLC source program of the machine 300 utilizing the program retrieval module 120 and interpret the obtained PLC source program of the machine 300 utilizing the interpreter module 130 to obtain the PLC signal address relation information, the logic switches and the responsive collect commands corresponding to the obtained PLC source program and then store the PLC signal address relation information, the logic switches and the responsive collect commands to the storage module 135.

For explanation, operations of remote monitoring methods are illustrated as examples in this embodiment, and those skilled in the art will understand that the present invention is not limited thereto. In one embodiment, the remote monitoring system 100 retrieves the PLC source program of the machine from a manufacturer of the machine. First, the manufacturer of the machine completes operations of registering the machine and uploading the PLC source program and interpreting the PLC source program before leaving the factory. Thereafter, when the machine is being installed in the factory, the manufacturer of the machine configures a parameter collect device at the factory side. When the factory reports to the manufacturer of the machine that the machine has a fault, the manufacturer of the machine can utilize the remote monitoring system 100 of the invention to retrieve the PLC parameter data of the machine at the remote side to obtain the status values of all of the logic switches on the machine and rearrange the PLC statuses to update contents of the PLC status of ladder diagram in real time. By doing so, engineers of the manufacturer of the machine can check and debug the problem of the machine remotely by using the status of each logic switch displayed on the PLC status of ladder diagram, thus capable of finding the error causes and fixing them quickly.

In another embodiment, the manufacturer of the machine may provide the PLC source program to an agent of the machine and the provided PLC source program may first be modified by the agent of the machine and then installed to the machine. Therefore, when performing a real-time retrieval operation of the PLC parameter data, the remote monitoring system 100 retrieves the currently executed PLC source program of the machine and recognizes that the version data of the currently executed PLC source program is not matched to the version data stored in the storage module. Thus, the remote monitoring system 100 retrieves the PLC source program of the machine from the agent of the machine and then interprets the retrieved PLC source program to retrieve PLC parameter data and updates the PLC status of ladder diagram accordingly.

Therefore, according to the remote monitoring systems and remote monitoring methods thereof of the invention, when the machine has a fault, by using the PLC source program and real-time parameter retrieval and data rearrangement remotely, a remote monitoring mode can be provided to provide a PLC status of ladder diagram corresponding to the machine at the remote side to display the parameter data corresponding to each logic switch of the ladder diagram in real time when the machine is executing the PLC source program and thus the fault causes of the machine can be determined and debugged quickly by checking the status of each logic switch based on the PLC status of ladder diagram. In addition, the remote monitoring systems and related remote monitoring methods of the invention can further be utilized to replace the image synchronization mode in the past without requiring additional accessories being installed to the machine, thereby effectively reducing costs and reducing distortions caused by the images.

Methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalent.

What is claimed is:

1. A remote monitoring system for remotely monitoring execution status of a Programmable Logic controller (PLC) program of a machine, comprising:
   a storage device, storing ladder diagram information corresponding to a PLC source program of the machine, wherein the PLC source program is generated by compiling a ladder diagram and the ladder diagram information includes a PLC signal address relation information, configurations of a plurality of logic switches for the ladder diagram and a responsive collect command of each logic switch of the ladder diagram for retrieving parameter data corresponding thereto, and the PLC signal address relation information indicates the relations of the logic switches on the ladder diagram;
   a parameter retrieval unit, respectively retrieving parameter data corresponding to the logic switches from the machine using the responsive collect commands of the logic switches; and
   a monitoring unit, generating a status of ladder diagram according to the configurations of the logic switches, the parameter data and the PLC signal address relation information, wherein the status of ladder diagram represents the parameter data corresponding to each logic switch of the ladder diagram when the machine is executing the PLC source program so as to remotely monitor execution status of the PLC program of the machine.

2. The remote monitoring system of claim 1, further comprising:
   a program retrieval unit, retrieving the PLC source program of the machine; and
   an interpreter unit, interpreting the PLC source program to obtain the PLC signal address relation information, the logic switches and the responsive collect commands corresponding to the PLC source program and storing the PLC signal address relation information, the logic switches and the responsive collect commands to the storage device.

3. The remote monitoring system of claim 2, wherein the program retrieval unit further obtains the PLC source program by one of the following methods:
   linking to a controller of machine tool to obtain the PLC source program stored in the controller of machine tool;
   linking to a collect device such that the collect device links to a controller of machine tool to obtain the PLC source program stored in the controller of machine tool and transmits the obtained PLC source program to the program retrieval unit;
   linking to a manufacturer-side equipment to obtain the PLC source program stored in the manufacturer-side equipment; and
   linking to an agent-side equipment to obtain the PLC source program stored in the agent-side equipment.

4. The remote monitoring system of claim 1, further comprising:
   a registration module, receiving a registration data corresponding to the machine, wherein the registration data includes an identification data corresponding to the machine and a version of PLC program corresponding to the PLC source program.

5. The remote monitoring system of claim 4, further comprising:
   a program retrieval unit, retrieving a current version of PLC program corresponding to a currently executed PLC source program of the machine, comparing and determining whether the version of PLC program matches the current version of PLC program, and if not matched, retrieving the currently executed PLC source program corresponding to the current version of PLC program; and
   an interpreter unit, interpreting the retrieved currently executed PLC source program to obtain the PLC signal address relation information, the logic switches and the responsive collect commands corresponding to the currently executed PLC source program and storing the PLC signal address relation information, the logic switches and the responsive collect commands to the storage device to update the PLC signal address relation information, the logic switches and the responsive collect commands.

6. The remote monitoring system of claim 5, wherein the parameter retrieval unit further retrieves updated parameter data using the updated collect commands and the monitoring unit further generates the updated status of ladder diagram according to the updated parameter data and the updated PLC signal address relation information.

7. The remote monitoring system of claim 1, wherein the parameter retrieval unit further utilizes a collect device configured on the machine to execute the collect commands to respectively retrieve the parameter data corresponding to the logic switches from the machine.

8. A remote monitoring method for remotely monitoring execution status of a Programmable Logic controller (PLC) program of a machine, comprising:
   utilizing a storage device for storing ladder diagram information corresponding to a PLC source program of the machine, wherein the PLC source program is generated by compiling a ladder diagram and the ladder diagram information includes a PLC signal address relation information, configurations of a plurality of logic switches for the ladder diagram and a responsive collect command of each logic switch of the ladder diagram for retrieving parameter data corresponding thereto, and the PLC signal address relation information indicates the relations of the logic switches on the ladder diagram;

utilizing a parameter retrieval unit for respectively retrieving parameter data corresponding to the logic switches from the machine using the responsive collect commands of the logic switches; and utilizing a monitoring unit for generating a status of ladder diagram according to the configurations of the logic switches, the parameter data and the PLC signal address relation information, wherein the status of ladder diagram represents the parameter data corresponding to each logic switch of the ladder diagram when the machine is executing the PLC source program so as to remotely monitor execution status of the PLC program of the machine.

9. The remote monitoring method of claim 8, further comprising:

utilizing a program retrieval unit for retrieving the PLC source program of the machine; and utilizing an interpreter unit for interpreting the PLC source program to obtain the PLC signal address relation information, the logic switches and the responsive collect commands corresponding to the PLC source program and storing the PLC signal address relation information, the logic switches and the responsive collect commands to the storage device.

10. The remote monitoring method of claim 9, wherein the step of utilizing the program retrieval unit to obtain the PLC source program is performed by one of the following methods:

the program retrieval unit linking to a controller of machine tool to obtain the PLC source program stored in the controller of machine tool;

the program retrieval unit linking to a collect device such that the collect device links to a controller of machine tool to obtain the PLC source program stored in the controller of machine tool and transmits the obtained PLC source program to the program retrieval unit;

the program retrieval unit linking to a manufacturer-side equipment to obtain the PLC source program stored in the manufacturer-side equipment; and the program retrieval unit linking to an agent-side equipment to obtain the PLC source program stored in the agent-side equipment.

11. The remote monitoring method of claim 8, further comprising:

utilizing a registration unit for receiving a registration data corresponding to the machine, wherein the registration data includes an identification data corresponding to the machine and a version of PLC program corresponding to the PLC source program.

12. The remote monitoring method of claim 11, further comprising:

utilizing a program retrieval unit for retrieving a current version of PLC program corresponding to a currently executed PLC source program of the machine, comparing and determining whether the version of PLC program matches the current version of PLC program, and if not matched, retrieving the currently executed PLC source program corresponding to the current version of PLC program; and utilizing an interpreter unit for interpreting the retrieved currently executed PLC source program to obtain the PLC signal address relation information, the logic switches and the responsive collect commands corresponding to the currently executed PLC source program and storing the PLC signal address relation information, the logic switches and the responsive collect commands to the storage device to update the PLC signal address relation information, the logic switches and the responsive collect commands.

13. The remote monitoring method of claim 12, further comprising:

utilizing the parameter retrieval unit for retrieving the updated parameter data using the updated collect commands; and utilizing the monitoring unit for generating the updated status of ladder diagram according to the updated parameter data and the updated PLC signal address relation information.

14. The remote monitoring method of claim 8, wherein the step of the parameter retrieval unit respectively retrieving the parameter data corresponding to the logic switches from the machine is performed by utilizing a collect device configured on the machine to execute the collect commands to respectively retrieve the parameter data corresponding to the logic switches from the machine.

15. A non-transitory computer-readable storage medium comprising a computer program, which, when executed, causes a device to perform a remote monitoring method for remotely monitoring execution status of a Programmable Logic controller (PLC) program of a machine, and the method comprising:

storing ladder diagram information corresponding to a PLC source program of the machine, wherein the PLC source program is generated by compiling a ladder diagram and the ladder diagram information includes a PLC signal address relation information, configurations of a plurality of logic switches for the ladder diagram and a responsive collect command of each logic switch of the ladder diagram for retrieving parameter data corresponding thereto, and the PLC signal address relation information indicates the relations of the logic switches on the ladder diagram;

respectively retrieving parameter data corresponding to the logic switches from the machine using the responsive collect commands of the logic switches; and generating a status of ladder diagram according to the configurations of the logic switches, the parameter data and the PLC signal address relation information, wherein the status of ladder diagram represents the parameter data corresponding to each logic switch of the ladder diagram when the machine is executing the PLC source program so as to remotely monitor execution status of the PLC program of the machine.

* * * * *